(12) United States Patent
Chen

(10) Patent No.: US 10,770,625 B1
(45) Date of Patent: Sep. 8, 2020

(54) SEMICONDUCTOR DEVICE PACKAGES

(71) Applicant: Advanced Semiconductor Engineering, Inc., Kaohsiung (TW)

(72) Inventor: Ying-Chung Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/413,472

(22) Filed: May 15, 2019

(51) Int. Cl.
| | |
|---|---|
| H01L 33/48 | (2010.01) |
| H01L 33/64 | (2010.01) |
| H01L 31/173 | (2006.01) |
| H01L 31/024 | (2014.01) |
| H01L 33/58 | (2010.01) |
| H01L 31/0203 | (2014.01) |
| H01L 33/62 | (2010.01) |
| H01L 31/0232 | (2014.01) |

(52) U.S. Cl.
CPC ........ *H01L 33/486* (2013.01); *H01L 31/0203* (2013.01); *H01L 31/024* (2013.01); *H01L 31/02327* (2013.01); *H01L 31/173* (2013.01); *H01L 33/483* (2013.01); *H01L 33/58* (2013.01); *H01L 33/62* (2013.01); *H01L 33/642* (2013.01); *H01L 33/644* (2013.01)

(58) Field of Classification Search
CPC ..... H01L 33/483; H01L 33/486; H01L 33/62; H01L 33/64; H01L 33/642; H01L 33/644
See application file for complete search history.

(56) References Cited

U.S. PATENT DOCUMENTS

| | | | |
|---|---|---|---|
| 7,456,483 B2 | 11/2008 | Tsukamoto et al. | |
| 2018/0233643 A1 | 8/2018 | Wu et al. | |
| 2018/0315894 A1 | 11/2018 | Ho et al. | |

*Primary Examiner* — Scott B Geyer
(74) *Attorney, Agent, or Firm* — Foley & Lardner LLP

(57) ABSTRACT

A semiconductor device package includes a substrate, a heat dissipation structure disposed on the substrate, and a first optical module disposed on the heat dissipation structure. The heat dissipation structure includes a housing, an optical component disposed on the housing, and a light-emitting device disposed in the housing and capable of emitting light toward the first optical component.

24 Claims, 8 Drawing Sheets

SEMICONDUCTOR DEVICE PACKAGES

BACKGROUND

1. Field of the Disclosure

The present disclosure relates to, amongst other things, a semiconductor device package, and a semiconductor device package including multiple modules.

2. Description of Related Art

A semiconductor device package may include some modules integrated therein, e.g. optical module(s), power module(s), communication module(s). Relatively high accuracy may be specified to assemble these modules to ensure performance of the semiconductor device package. However, some methods used to manufacture the above-mentioned semiconductor device package may involve relatively great cost and size.

SUMMARY

According to some example embodiments of the instant disclosure, a semiconductor device package includes a substrate, a heat dissipation structure disposed on the substrate, and a first optical module disposed on the heat dissipation structure. The heat dissipation structure includes a housing, an optical component disposed on the housing and a light-emitting device disposed in the housing and capable of emitting light toward the first optical component.

According to some example embodiments of the instant disclosure, a semiconductor device package includes a first substrate; a first optical module disposed on the first substrate and a second optical module disposed at a side to the first optical component. The first optical module includes a housing, a first optical component disposed on the housing, and a light-emitting device disposed in the housing and emitting light toward the first optical component. The second optical module includes a second substrate disposed on the first substrate, a detector module disposed on the second substrate, and a first lid disposed on the detector module and having an extension portion in direct contact with the detector module.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

DETAILED DESCRIPTION

Figure 1:
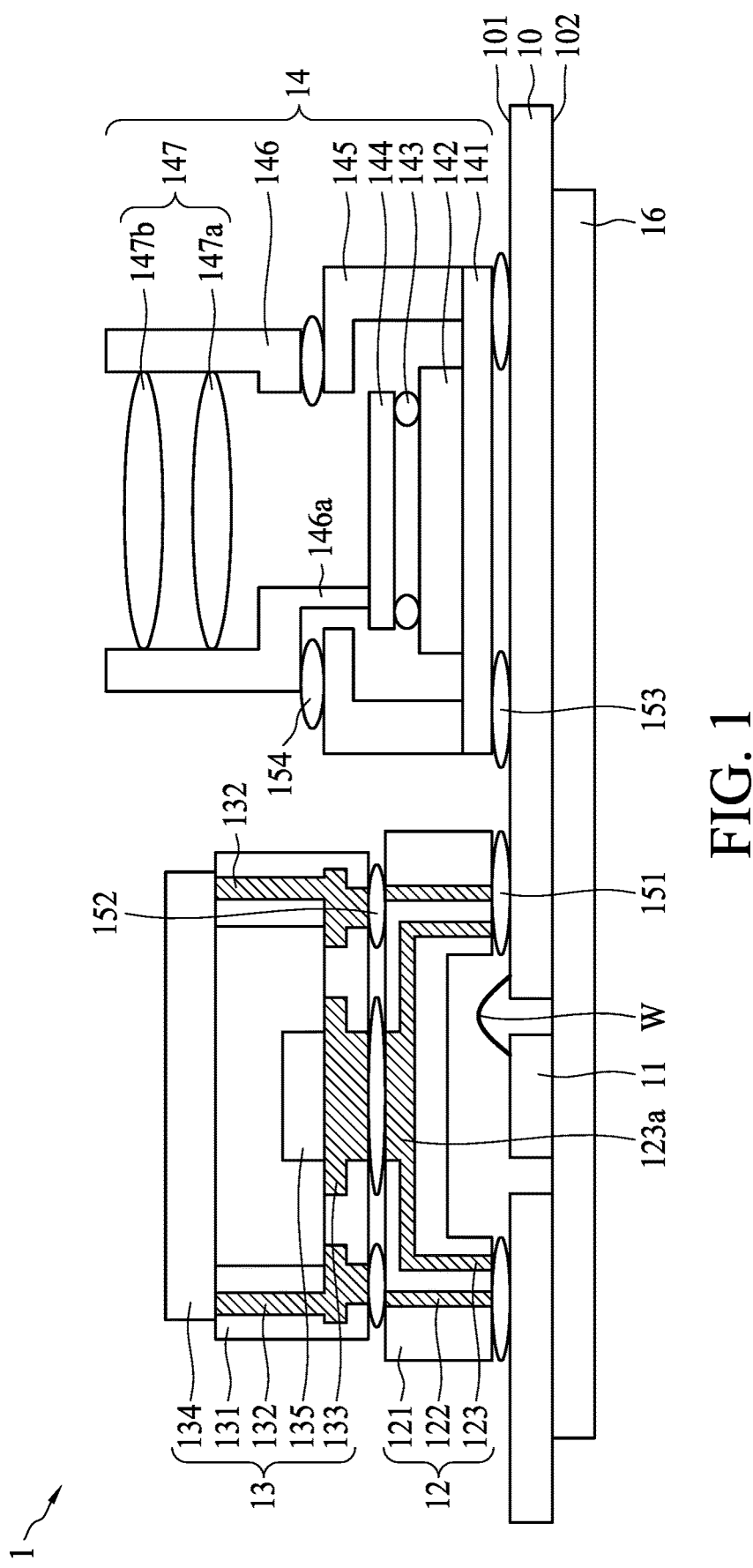
FIG. 1 is a cross-sectional view of a semiconductor device package in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 is a cross-sectional view of a semiconductor device package in accordance with some embodiments of the present disclosure.

Referring to FIG. 1, the semiconductor device package 1 may include a substrate 10, a semiconductor device 11, a substrate 12, an optical module 13, another optical module 14, and a stiffener 16.

The substrate 10 may include some conductive elements, for example but is not limited to, conductive trace(s), pad(s), via(s) (not illustrated in FIG. 1). The substrate 10 may include a redistribution structure (not illustrated in FIG. 1). The substrate 10 may include circuitry (not illustrated in FIG. 1). The substrate 10 may include insulation material(s) or dielectric material(s). The substrate 10 can include a core or relatively hard material. The substrate 10 can include flexible or relatively soft material. The substrate 10 may include a surface 101 and another surface 102 opposite the surface 101.

The substrate 10 can include insulation or dielectric material, which may include resin (e.g. bismaleimide triazine resin (BT). The substrate 10 can include insulation or dielectric material, which may include glass fiber (e.g. woven glass, pre-impregnated composite fibers (prepreg)). The substrate 10 can include insulation or dielectric material, which may include particles (e.g. $SiO_2$ particles). The substrate 10 can include insulation or dielectric material, which may include epoxy. The substrate 10 can include insulation or dielectric material, which may include molding compound or encapsulation material.

The semiconductor device 11 can be disposed on the stiffener 16. The semiconductor device 11 can be disposed in the substrate 10. The semiconductor device 11 can be embedded in the substrate 10. An opening (not denoted in FIG. 1) may be formed in the substrate 10 to accommodate or receive the semiconductor device 11. The substrate 10 may define an opening (not denoted in FIG. 1) to accommodate or receive the semiconductor device 11. The substrate 10 may define a through hole (not denoted in FIG. 1) which penetrates the substrate 10 to accommodate or receive the semiconductor device 11. Although it is not illustrated in FIG. 1, The substrate 10 may define a recess instead of a through opening to accommodate or receive the semiconductor device 11.

The semiconductor device 11 may include, for example but is not limited to, a processor, a controller, a microcontroller (MCU), or other electronic component(s). The semiconductor device 11 can be electrically connected to the substrate 10. The semiconductor device 11 can be electrically connected to the substrate 10 by the conductive wire(s) W. The semiconductor device 11 may include a wire-bond type semiconductor die or chip. The semiconductor device 11 may include a flip-chip type semiconductor die or chip in accordance with some other embodiments of the present disclosure.

The stiffener 16 can include relatively hard material to reinforce the semiconductor device package 1. The stiffener 16 may be disposed on the surface 102 of the substrate 10. The stiffener 16 may be attached to the surface 102 of the substrate 10.

The substrate 12 can include insulation or dielectric material 121, conductive structure 122 and conductive structure 123.

The insulation or dielectric material 121 may include resin (e.g. bismaleimide triazine resin (BT)). The insulation or dielectric material 121 may include glass fiber (e.g. woven glass, pre-impregnated composite fibers (prepreg)). The insulation or dielectric material 121 may include particles (e.g. $SiO_2$ particles). The insulation or dielectric material 121 may include epoxy. The insulation or dielectric material 121 may include molding compound or encapsulation material.

The substrate 12 may be disposed on the substrate 10. The substrate 12 may be disposed on the surface 101 of the substrate 10. The substrate 12 may be attached to the surface 101 of the substrate 10. The substrate 12 may be disposed on the semiconductor device 11. The substrate 12 may cover the semiconductor device 11. The substrate 12 may have a recess to accommodate or receive the semiconductor device 11. The substrate 12 may have a recess to accommodate or receive the conductive wire W.

The conductive structure 122 and conductive structure 123 may be disposed in the insulation or dielectric material 121. The conductive structure 122 and conductive structure 123 may be embedded in the insulation or dielectric material 121.

The conductive structure 122 may include thermally conductive material. The conductive structure 122 may include electrically conductive material. The conductive structure 122 may include, for example but is not limited to, copper (Cu), aluminum (Al), gold (Au), silver (Ag) or other suitable material(s). The conductive structure 122 may include metal or alloy. The conductive structure 122 may include non-metal material, for example but is not limited to, graphene or other suitable material(s).

The conductive structure 123 may include thermally conductive material. The conductive structure 123 may include electrically conductive material. The conductive structure 123 may include, for example but is not limited to, copper (Cu), aluminum (Al), gold (Au), silver (Ag) or other suitable material(s). The conductive structure 123 may include metal or alloy. The conductive structure 123 may include non-metal material, for example but is not limited to, graphene or other suitable material(s). The conductive structure 123 may include a relatively great pad 123a.

The substrate 12 may function as a heat dissipation structure. The conductive structure 122 may function as a heat dissipation structure. The conductive structure 123 may function as a heat dissipation structure.

The substrate 12 can be electrically connected to the substrate 10 by the connection elements 151. The substrate 12 can be thermally connected to the substrate 10 by the connection elements 151. The conductive structure 122 may be in direct contact with the connection elements 151. The conductive structure 123 may be in direct contact with the connection elements 151.

The connection element 151 may include, for example but is not limited to, solder, conductive adhesive (e.g. resin mixed with conductive particles) or other suitable bonding material(s).

The optical module 13 may include insulation or dielectric material 131, a conductive structure 132, a base 133, an optical component 134 and a semiconductor device 135.

The optical module 13 can be disposed on the substrate 10. The optical module 13 can be disposed on the substrate 12.

The insulation or dielectric material 131 can be same or similar to the insulation or dielectric material 121. The insulation or dielectric material 131 can be different from the insulation or dielectric material 121.

The conductive structure 132 may include material same or similar to the conductive structure 121. The conductive structure 132 may include material same or similar to the conductive structure 122. The conductive structure 132 can be disposed or embedded in the insulation or dielectric material 131.

The base or conductive base 133 may include material same or similar to the conductive structure 121. The base or conductive base 133 may include material same or similar to the conductive structure 122. The base or conductive base 133 can be disposed or embedded in the insulation or dielectric material 131.

The conductive structure 132 and the base 133 may include a leadframe. The conductive structure 132 and the base 133 may include a part of a leadframe. The conductive structure 132 and the base 133 may include a patterned copper plate or copper foil.

The conductive structure 132 and the base 133 may be formed by disposing some conductive pillars or posts (not denoted in FIG. 1) on a leadframe. Part of the conductive structure 132 may be formed by plating technique. The insulation or dielectric material 131 can encapsulate the conductive structure 132. The insulation or dielectric material 131 can encapsulate the base 133.

The semiconductor device 135 may include a wire-bond type semiconductor die or chip. The semiconductor device 135 may include a flip-chip type semiconductor die or chip. The semiconductor device 135 may include, for example but is not limited to, a power die, an optical die, an light emitting die (e.g. a light emitter diode (LED) die, a vertical-cavity surface-emitting laser) or the like. The semiconductor device 135 may emit visible light. The semiconductor device 135 may emit light having wavelengths within a range (e.g. infrared (IR) light).

The insulation or dielectric material 131, the conductive structure 132 and the base 133 may function as a housing (not denoted in FIG. 1). The housing may define a space or recess to accommodate or receive the semiconductor device 135. The semiconductor device 135 can be disposed on the conductive base 133. The semiconductor device 135 can be disposed on the conductive base 133 by a bonding material (e.g. an adhesive or a conductive adhesive). The base 133 can support the semiconductor device 135. The semiconductor device 135 may be electrically connected to the conductive structure 132. The base 133 may include a portion exposed by the insulation material 131 (not denoted in FIG. 1), and the portion may have a width substantially the same to the pad 123a of the substrate 12. The base 133 may include a portion exposed by the insulation material 131 (not denoted in FIG. 1), and the portion may have an area substantially the same to the pad 123a of the substrate 12.

The optical component 134 may include a plate or film transparent to light having wavelength(s) within a range. For example, if light emitted from the semiconductor device 135 include visible light, the optical component 134 may include a glass plate (or film), a plastic plate (or film) that is transparent to human eyes. For example, if light emitted from the semiconductor device 135 include IR light, the optical component 134 may include silicon (Si) or other material(s) that allows the IR light to pass through. The optical component 134 may include, for example but is not limited to, a filter, a beam shaping element, a diffraction optical element (DOE), a diffuser, a micro lens array (MLA). The optical component 134 may include conductive structure. The optical component 134 may include transparent conductive structure, for example but is not limited to, Indium Tin Oxide (ITO) or Indium Doped Zinc Oxide (IZO).

The optical component 134 may be eliminated in accordance with some other embodiments of the present disclosure.

The optical component 134 may be electrically connected to the conductive structure 132. The optical component 134 may be electrically connected to the housing.

The optical module 13 can be electrically connected to the substrate 12 by the connection elements 152. The optical module 13 can be thermally connected to the substrate 12 by the connection elements 152. The conductive structure 132 may be in direct contact with the connection elements 152. The conductive base 133 may be in direct contact with the connection elements 152.

The connection element 152 may include material similar or same to the connection element 151. The connection element 152 may include material different from the connection element 151.

The semiconductor device package 1 may support or facilitate, for example but is not limited to, power supply, which means the semiconductor device 135 (e.g. power die 135) may produce relatively great heat.

The semiconductor device package 1 may support or facilitate, for example but is not limited to, virtual reality (VR) technique, augmented reality (AR) technique, mixed reality (MR) technique or the like. Light emitted from the semiconductor device 135 may be specified to reach an object at a position of about one to three meters from the semiconductor device package 1, in other words, the semiconductor device 135 may specify an electrical power up to about two to four watts, which may result in relatively great heat during operation of the semiconductor device package 1.

Heat generated by the semiconductor device 135 can be dissipated by the substrate 12. A thermally conductive path, which may include the conductive base 133, the connection element 152, the conductive structure 123 and connection element 151, may help to transfer the heat generated by the semiconductor device 135 to the substrate 10. The conductive base 133, which has a relatively great width or cross-section area than the conductive structure 132, may facilitate heat dissipation. The pad 123a, which has a relatively great width or cross-section area than the conductive structure 122, may facilitate heat dissipation.

The semiconductor device 135 may be controlled by the semiconductor device 11. The semiconductor device 135 may be electrically connected to the semiconductor device 11.

If the optical component 134 is detached from housing or the conductive structure 132, an open circuit may be detected by the semiconductor device 11, and the semiconductor device 11 may cut off the power of the semiconductor device 135. Accordingly, if the semiconductor device 135 is a light emitting device, the semiconductor device 135 would stop operating, thus avoiding shining light directly in to a person's eyes (e.g. a person who may be using an apparatus including the semiconductor device package 1), or avoiding light pollution or emission of light that is otherwise undesirable.

The optical module 14 can be disposed on the substrate 10. The optical module 14 can be disposed to a side of the optical module 13. The optical module 14 can be disposed to a side of the optical module 13 on the substrate 10. The optical module 14 can be electrically connected to the substrate 10. The optical module 14 can be electrically connected to the substrate 10 by the connection element 153.

The connection element 153 may include material similar or same to the connection element 151. The connection element 153 may include material different from the connection element 151.

The optical module 14 may include a substrate 141, a semiconductor device 142, connection elements 143, a cover 144, a lid 145, another lid 146 and a lens assembly 147.

The substrate 141 may include structure similar or same to the substrate 10. The substrate 141 may include structure different from the substrate 10. The substrate 141 may be electrically connected to the substrate 10 by the connection element 153.

The semiconductor device 142 may be disposed on the substrate 141. The semiconductor device 142 may include a wire-bond type semiconductor die or chip. The semiconductor device 142 may include a flip-chip type semiconductor die or chip. The semiconductor device 142 may include, for example but is not limited to, a sensor die, an optical die, an optical sensor die (e.g. a light detector die, a photo detector) or the like. The semiconductor device 142 can receive light passing through the lens assembly 147. The semiconductor device 142 can receive light passing through the cover 144.

The cover 144 may be disposed on the semiconductor device 142. The cover 144 may be attached to the semiconductor device 142. The cover 144 may be attached to the semiconductor device 142 by the connection elements 143. The cover 144 may be sealed to the semiconductor device 142 by the connection elements 143.

The cover 144 may include a plate or film transparent to light having wavelength(s) within a range. For example, if light passing through the lens assembly 147 include visible light, the cover 144 may include a glass plate (or film), a plastic plate (or film) that is transparent to human eyes. For example, if light passing through the lens assembly 147 include IR light, cover 144 may include silicon (Si) or other material(s) that allows the IR light to pass through. The cover 144 may include filter.

The connection element 143 may include, for example but is not limited to, solder, adhesive (which may include conductive adhesive (e.g. resin mixed with conductive particles) or non-conductive adhesive), or other suitable bonding material(s).

The semiconductor device 142, the connection elements 143 and the cover 144 may function as a detector module (not denoted in FIG. 1).

The lid 145 may be disposed on the substrate 141. The lid 145 may be attached to the substrate 141. The lid 145 may cover the substrate 142. The lid 145 may cover the connection element 143. The lid 145 may cover the cover 144. The lid 145 may cover the detector module. The lid 145 may define a space or room to accommodate or receive the detector module. The lid 145 may have a relatively less size. The lid 145 may have a relatively less width.

The lid 145 may include, for example but is not limited to, plastic, polymer, metal, or other suitable material. The lid 145 may include opaque material. The lid 145 may include material to avoid light pollution or emission of light that is otherwise undesirable.

The lid 146 may include material same or similar to the lid 145. The lid 146 may include material different from the lid 145.

The lid 146 may be disposed on the substrate 10. The lid 146 may be disposed on the substrate 141. The lid 146 may be disposed on the detector module. The lid 146 may be disposed on the lid 145. The lid 146 may be attached to the lid 145. The lid 146 may be cover the lid 145. The lid 146 may be attached to the lid 145 by the connection elements 154. The connection element 154 may be disposed between the lid 145 and the lid 146. The lid 146 may have a relatively less size. The lid 146 may have a relatively less width.

The lid 146 may have an extension portion 146*a*. The extension portion 146*a* of the lid 146 can be in direct contact with the detector module. The extension portion 146*a* of the lid 146 can be in direct contact with the cover 144. The extension portion 146*a* of the lid 146 may extend below the connection element 154. The extension portion 146*a* of the lid 146 may extend over the connection element 154. The extension portion 146*a* of the lid 146 may extend over an upper portion (not denoted in FIG. 1) of the lid 145. The extension portion 146*a* of the lid 146 may extend into a space or room defined by the lid 145.

The lid 146 may define a space or room to accommodate or receive the lens assembly 147.

The connection element 154 may include, for example but is not limited to, solder, adhesive (which may include conductive adhesive (e.g. resin mixed with conductive particles) or non-conductive adhesive), or other suitable bonding material(s).

The lens assembly 147 may include lens 147*a* and lens 147*b*. The lens assembly 147 may include more or less lens. The lens 147*a* may be held by the lid 146. The lens 147*b* may be held by the lid 146. The lens 147*a* may be fixed or mounted to the lid 146. The lens 147*b* may be fixed or mounted to the lid 146. The lens assembly 147 and the lid 146 may be formed in one piece.

A number of detector modules, each of which may include the semiconductor device 142, the connection elements 143 and the cover 144, may be formed by attaching the cover 144 onto each of the semiconductor device 142 of a wafer and sawing the wafer. Such pre-formed detector module (which can be formed prior to assembly of the semiconductor device package 1) can prevent the semiconductor device 142 from pollution (e.g. dust, water, or other particles) during manufacturing.

The lens assembly 147 may be integrated with the lid 146 prior to assembly of the semiconductor device package 1. The extension 146*a* may help the lens assembly 147 to align with the semiconductor device 142. The extension 146*a* may help the lens assembly 147 to elevationally align with the semiconductor device 142. The extension 146*a* may ensure focus of the lens assembly 147 can substantially fall on a sensing surface or area of the semiconductor device 142. For example, during the operation of attaching the lid 146 (which may be integrated with the lens assembly 147) to the lid 145, the operation may be stop when the extension 146*a* is in contact with the cover 144.

The effective optical path or focal distance between the lens assembly 147 and the semiconductor device 142 may depend on the length of the extension portion 146*a*. The effective optical path or focal distance between the lens assembly 147 and the semiconductor device 142 may depend on (may be set as a function of) the thickness of the extension portion 146*a*. Such arrangements may mitigate or minimize optical issues caused by assembly misalignment/deviation. Such arrangements may mitigate or minimize optical issues caused by deviation from a manufacturing tolerance/deviation.

Figure 2:
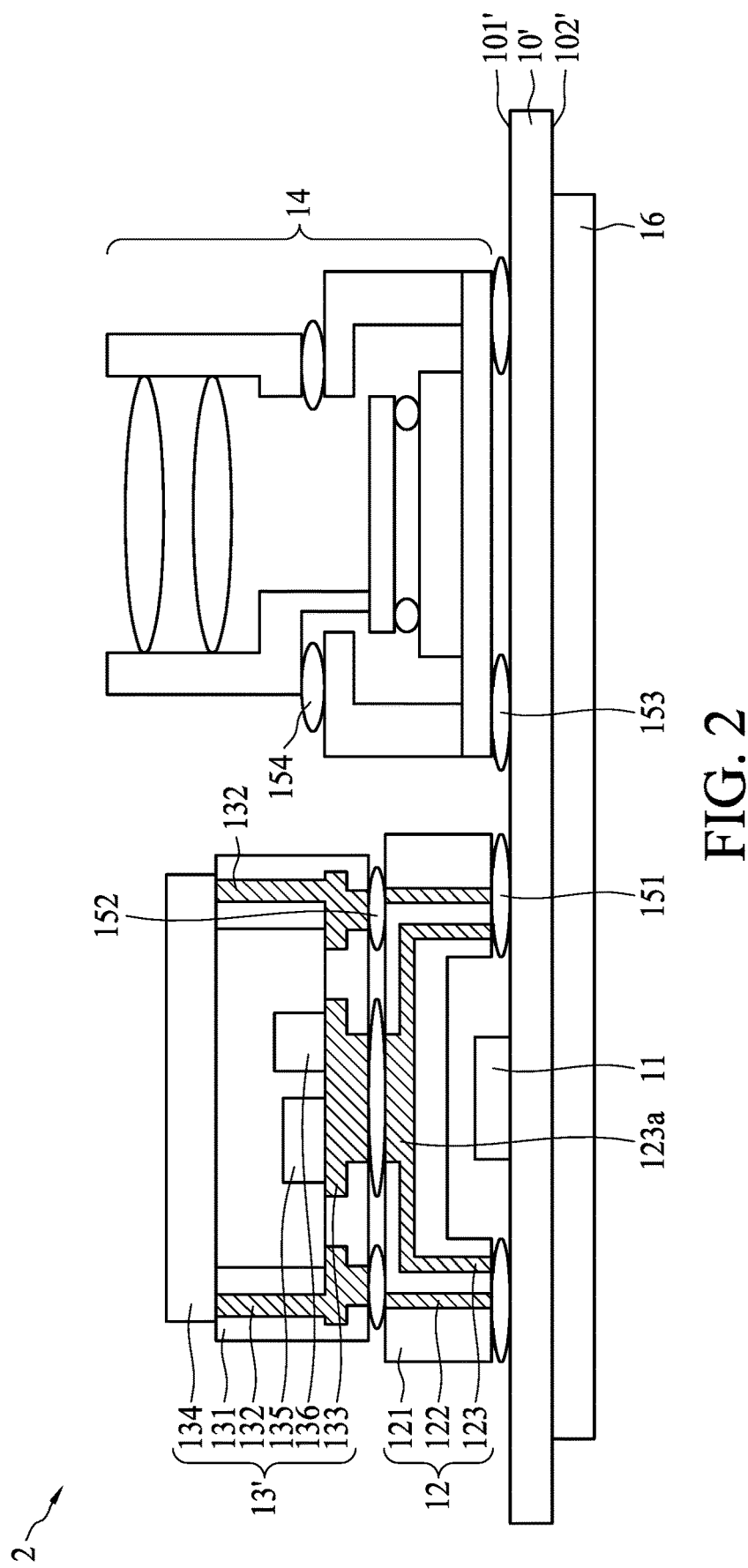
FIG. 2 is a cross-sectional view of a semiconductor device package in accordance with some embodiments of the present disclosure.

FIG. 2 is a cross-sectional view of a semiconductor device package in accordance with some embodiments of the present disclosure.

The semiconductor device package 2 is similar to the semiconductor device package 1 as illustrated and described with reference to FIG. 1, except that another semiconductor device 136 is introduced the optical module 13 to form an optical module 13', the substrate 10 is replaced by the substrate 10' and the semiconductor device 11 may be disposed on the substrate 10'. The conductive structure 132 may be electrically connected to the semiconductor device 136.

The semiconductor device 136 may include a wire-bond type semiconductor die or chip. The semiconductor device 136 may include a flip-chip type semiconductor die or chip. The semiconductor device 136 may include, for example but is not limited to, a sensor die, an optical die, an optical sensor die (e.g. a light detector die, a photo detector), a micro electro mechanical system (MEMS) die, a pressure sensor die, a humidity sensor die or the like.

If the optical component 134 is detached from housing or the conductive structure 132, an open circuit may be detected by the semiconductor device 11, and the semiconductor device 11 may cut off the power of the semiconductor device 135.

If the optical component 134 is detached from housing or the conductive structure 132, change(s) of light may be detected by semiconductor device 136, which may trigger the semiconductor device 11 to cut off the power of the semiconductor device 135.

If the optical component 134 is detached from housing or the conductive structure 132, change(s) of pressure may be detected by semiconductor device 136, which may trigger the semiconductor device 11 to cut off the power of the semiconductor device 135.

If the optical component 134 is detached from housing or the conductive structure 132, change(s) of humidity may be detected by semiconductor device 136, which may trigger the semiconductor device 11 to cut off the power of the semiconductor device 135.

Accordingly, if the semiconductor device 135 is a light emitting device, the semiconductor device 135 would stop operating, thus avoiding shining light directly in to a person's eyes (e.g. a person who may be using an apparatus including the semiconductor device package 2), or avoiding light pollution or emission of light that is otherwise undesirable.

Figure 2A:
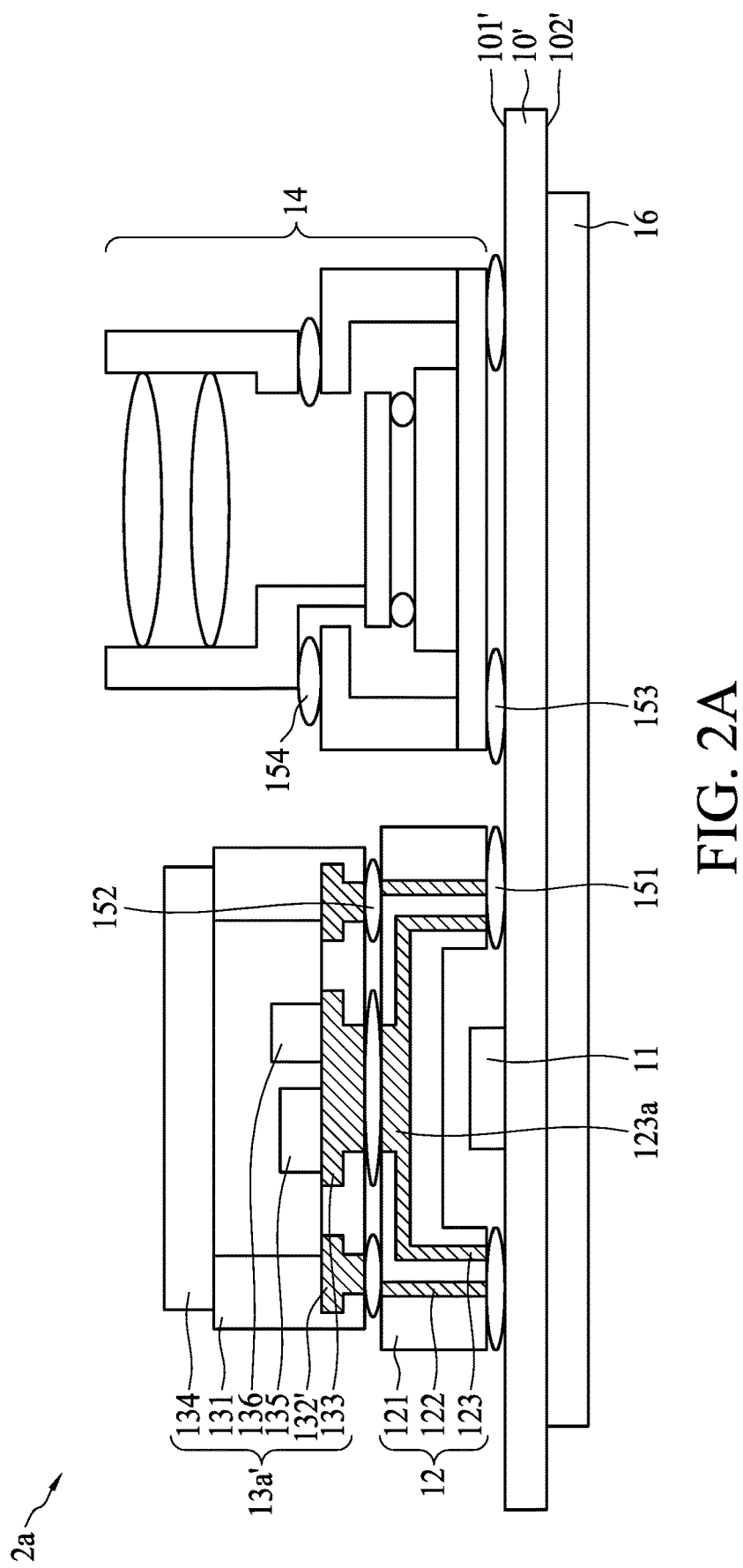
FIG. 2A is a cross-sectional view of a semiconductor device package in accordance with some embodiments of the present disclosure.

FIG. 2A is a cross-sectional view of a semiconductor device package in accordance with some embodiments of the present disclosure.

The semiconductor device package 2a is similar to the semiconductor device package 2 as illustrated and described with reference to FIG. 2, except that the conductive structure 132 of the optical module 13' is replaced by a conductive structure 132' to form an optical module 13a'.

The conductive structure 132' is similar to the conductive structure 132 as described and illustrated with reference to FIG. 1, except that the conductive posts or pillar of the conductive structure 132 are eliminated. The insulation or dielectric material 131, the conductive structure 132' and the conductive base 133 may function as a housing (not denoted in FIG. 2A). The housing may be electrically disconnected from the optical component 134. The conductive structure 132' may be electrically disconnected from the optical component 134. The conductive structure 132' may be electrically connected to the semiconductor device 136.

If the optical component 134 is detached from housing or the conductive structure 132, change(s) of light may be detected by semiconductor device 136, which may trigger the semiconductor device 11 to cut off the power of the semiconductor device 135.

If the optical component 134 is detached from housing or the conductive structure 132, change(s) of pressure may be detected by semiconductor device 136, which may trigger the semiconductor device 11 to cut off the power of the semiconductor device 135.

If the optical component 134 is detached from housing or the conductive structure 132, change(s) of humidity may be detected by semiconductor device 136, which may trigger the semiconductor device 11 to cut off the power of the semiconductor device 135.

Accordingly, if the semiconductor device 135 is a light emitting device, the semiconductor device 135 would stop operating, thus avoiding shining light directly in to a person's eyes (e.g. a person who may be using an apparatus including the semiconductor device package 2a), or avoiding light pollution or emission of light that is otherwise undesirable.

Figure 3:
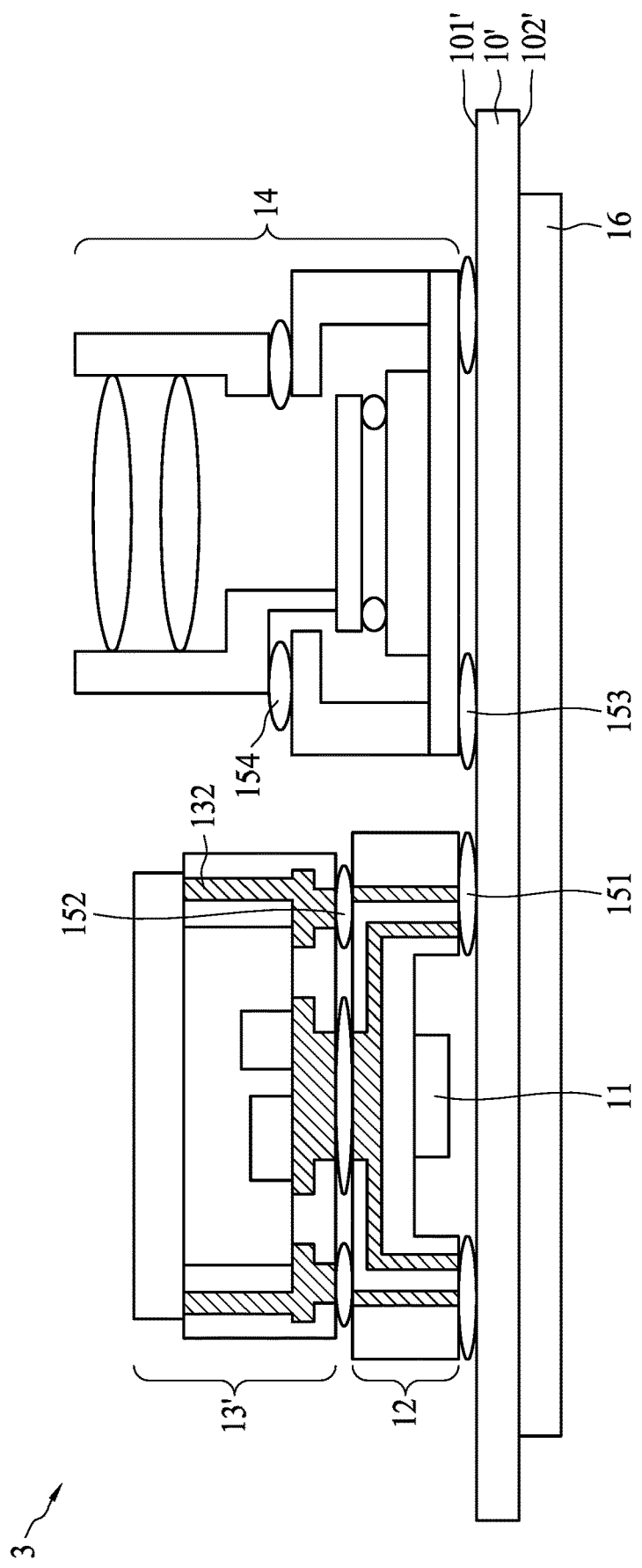
FIG. 3 is a cross-sectional view of a semiconductor device package in accordance with some embodiments of the present disclosure.

FIG. 3 is a cross-sectional view of a semiconductor device package in accordance with some embodiments of the present disclosure.

The semiconductor device package 3 is similar to the semiconductor device package 2 as illustrated and described with reference to FIG. 2, except that the semiconductor device 11 may be changed to be attached to the substrate 12.

Figure 3A:
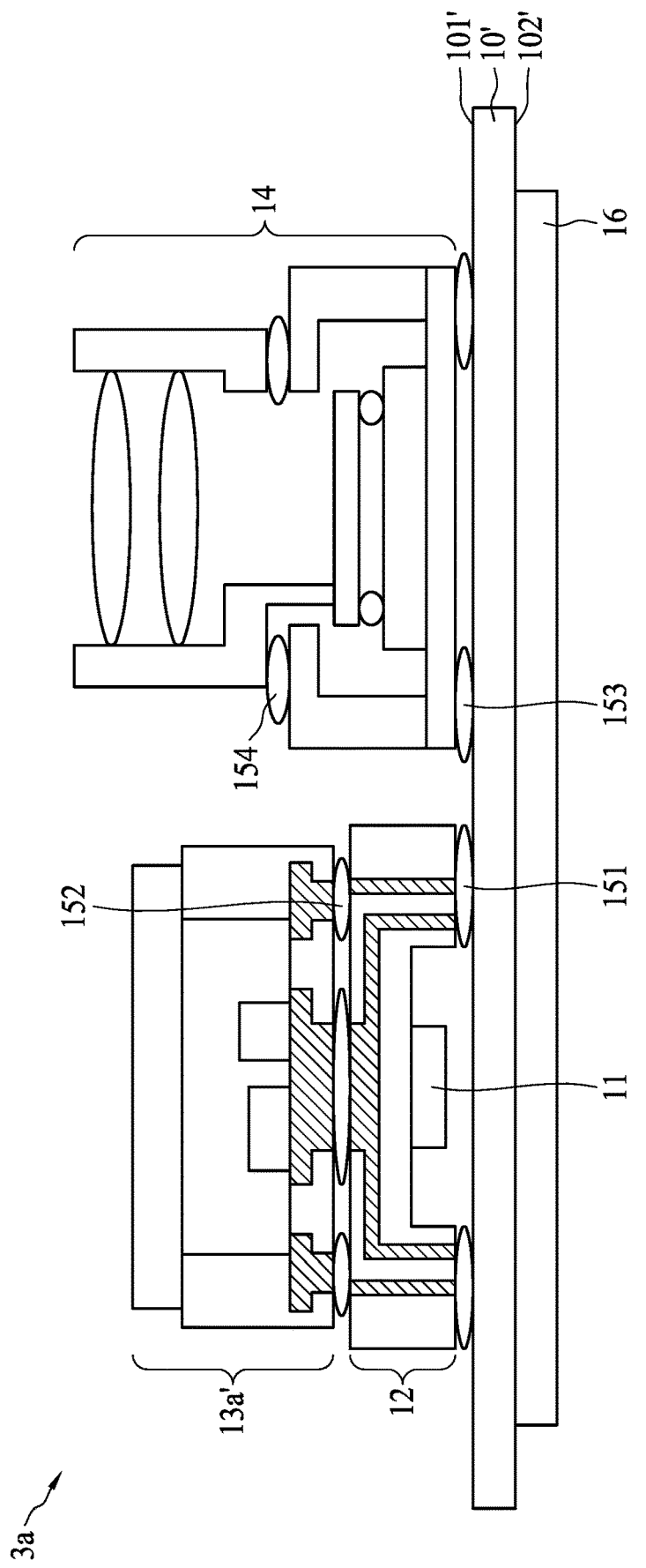
FIG. 3A is a cross-sectional view of a semiconductor device package in accordance with some embodiments of the present disclosure.

FIG. 3A is a cross-sectional view of a semiconductor device package in accordance with some embodiments of the present disclosure.

The semiconductor device package 3a is similar to the semiconductor device package 2a as illustrated and described with reference to FIG. 2A, except that the semiconductor device 11 may be changed to be attached to the substrate 12.

Figure 4:
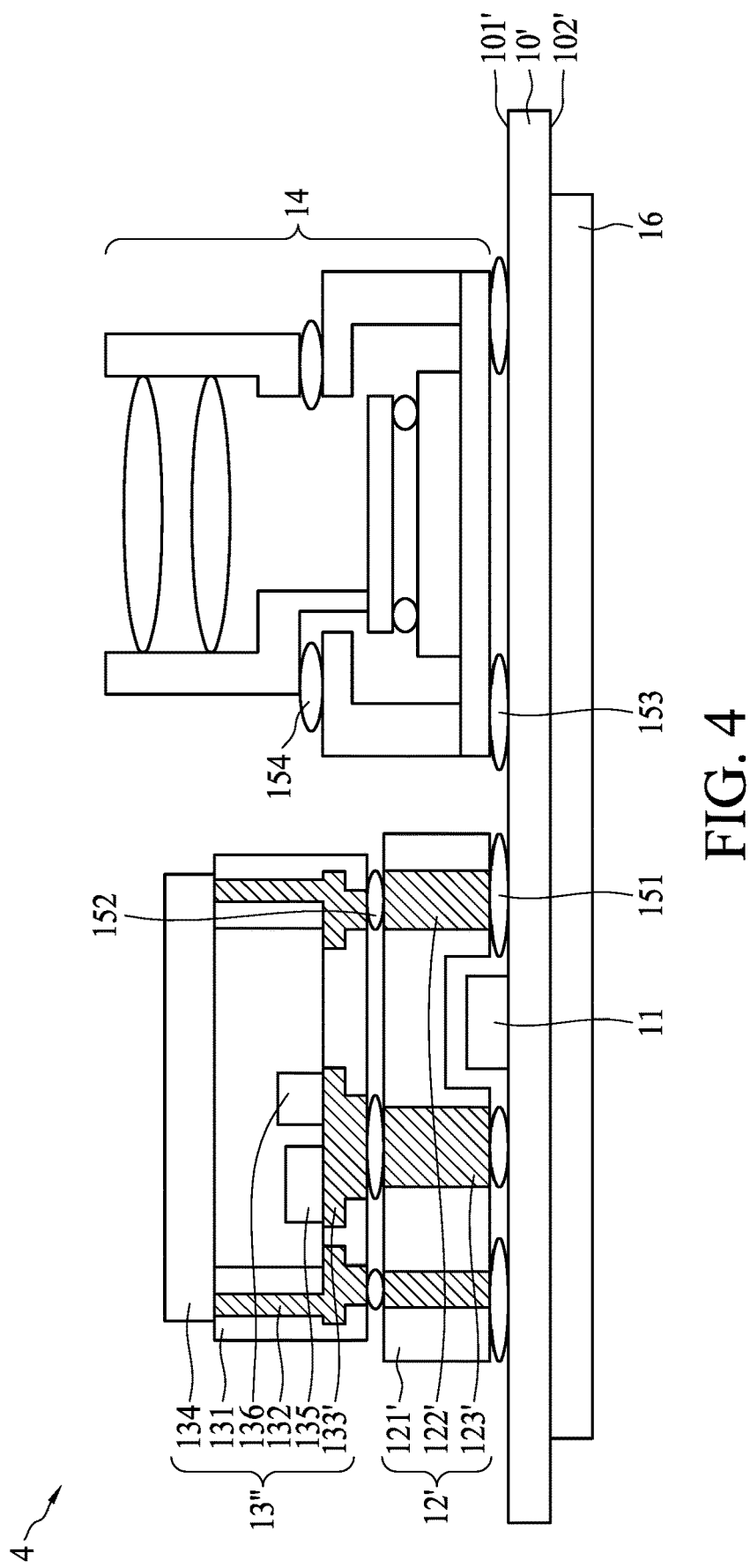
FIG. 4 is a cross-sectional view of a semiconductor device package in accordance with some embodiments of the present disclosure.

FIG. 4 is a cross-sectional view of a semiconductor device package in accordance with some embodiments of the present disclosure.

The semiconductor device package 4 is similar to the semiconductor device package 2 as illustrated and described with reference to FIG. 2, except that the substrate 12 is replaced by the substrate 12' and the optical module 13' is replaced by the optical module 13".

The substrate 12' is similar to the substrate 12 as illustrated and described with reference to FIG. 2, except that the conductive structure 122 is replaced by a relatively greater conductive structure 122' and the conductive structure 123 is replaced by a relatively greater conductive structure 123'. The insulation or dielectric material 121' may be same or similar to the insulation or dielectric material 121. The substrate 12' is similar to the substrate 12 as illustrated and described with reference to FIG. 2, except that the recess defined by the substrate 12' may be adjacent to one side of the semiconductor device package 4 than the other side.

The optical module 13' is similar to the optical module 13 as illustrated and described with reference to FIG. 2, except that the conductive base 133 is replaced by the conductive base 133'. The conductive base 133' may be disposed to be adjacent to one side of the semiconductor device package 4 than the other side.

Figure 4A:
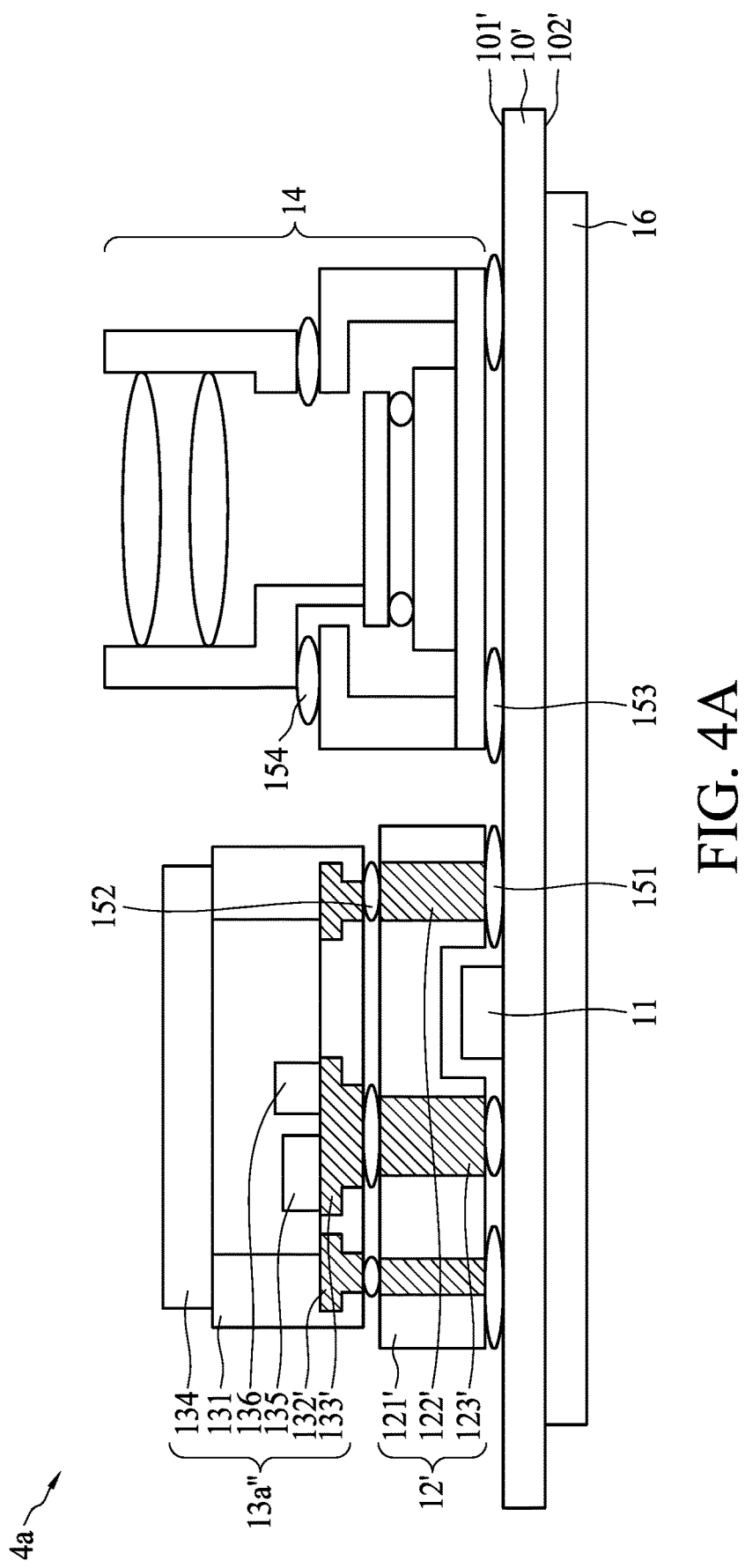
FIG. 4A is a cross-sectional view of a semiconductor device package in accordance with some embodiments of the present disclosure.

FIG. 4A is a cross-sectional view of a semiconductor device package in accordance with some embodiments of the present disclosure.

The semiconductor device package 4a is similar to the semiconductor device package 4 as illustrated and described with reference to FIG. 4, except that the optical module 13" is replaced by the optical module 13a".

The conductive structure 132' is similar to the conductive structure 132 as described and illustrated with reference to FIG. 4, except that the conductive posts or pillar of the conductive structure 132 are eliminated. The insulation or dielectric material 131, the conductive structure 132' and the conductive base 133 may function as a housing (not denoted in FIG. 4A). The housing may be electrically disconnected from the optical component 134. The conductive structure 132' may be electrically disconnected from the optical component 134. The conductive structure 132' may be electrically connected to the semiconductor device 136.

Figure 5:
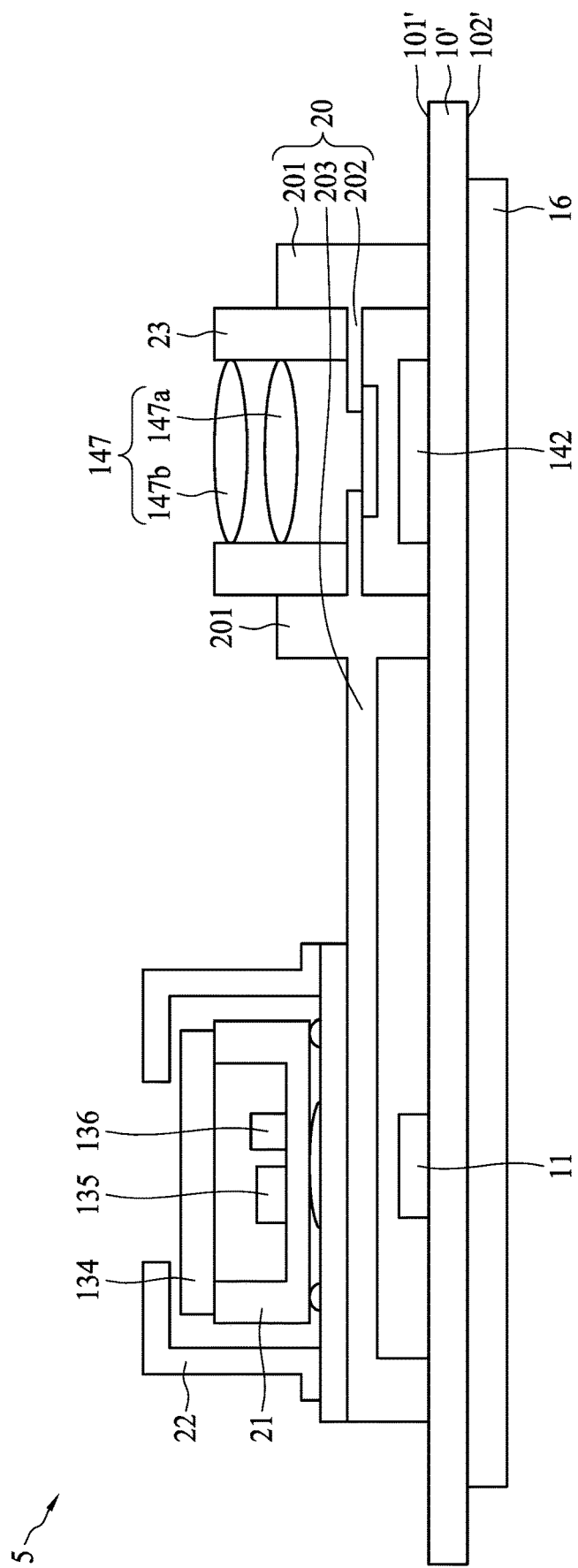
FIG. 5 is a cross-sectional view of a semiconductor device package in accordance with a comparative embodiment of the present disclosure.

FIG. 5 is a cross-sectional view of a semiconductor device package in accordance with a comparative embodiment of the present disclosure.

Each of the semiconductor device packages 1, 2, 2a, 3, 3a, 4 and 4a may include thermal resistive material. Each of the components of the semiconductor device packages 1, 2, 2a, 3, 3a, 4 and 4a may include thermal resistive material. Each of the semiconductor device packages 1, 2, 2a, 3, 3a, 4 and 4a may include thermal resistive material to ensure reliability after thermal cycles (e.g. reflow operation).

Referring to FIG. 5, the semiconductor device package 5 may include a substrate 10', a semiconductor device 11, a semiconductor device 142, a semiconductor device 135, a semiconductor device 136, an optical component 134, a carrier 20, a ceramic housing 21, a holding or clamping mechanism 22, a lid 23, a lens assembly 147 and a stiffener 16.

The carrier 20 may include plastic material. The carrier 20 may be formed in one piece. The carrier 20 may be formed injection technique. The carrier 20 may include a sidewall 201. The sidewall 201 may have some threads (not illustrated in FIG. 5). The lid 23 may have some threads (not illustrated in FIG. 5). The threads of the sidewall 201 may match the threads of the lid 23. The lid 23 (with integrated lens assembly 147) may be screwed into the sidewall 201. The lid 23 (with integrated lens assembly 147) may be engaged with the sidewall 201. The lid 23 (with integrated lens assembly 147) may be driven into the sidewall 201 to adjust or calibrate the distance from the lens assembly 147 to the semiconductor device 142. The sidewall 201 may have relatively great size or width in order to reinforce structure while providing screw threads. The lid 23 may have relatively great size or width \in order to reinforce structure while providing screw threads. Engagement of the lid 23 and the carrier 20 could be time-consuming for calibration.

The carrier 20 may include an extension portion 202. A transparent plate (not denoted in FIG. 5) may be attached to the extension portion 202 of the carrier 20. The transparent plate may be polluted by particles generated from driving or screwing the lid 23, which may adversely affect performance of the semiconductor device package 5.

The carrier 20 may include an extension portion 203. The extension portion 203 may support ceramic housing 21. The ceramic housing 21 may be attached to a substrate (not denoted in FIG. 5), which may be attached to the extension portion 202 and electrically connected to the substrate 10'. The carrier 20 may have a relatively great size or width.

Heat from the semiconductor device 135 may not be relatively well dissipated by the carrier 20.

The holding or clamping mechanism 22 may include metal or alloy to prevent the optical component 134 from detaching off the ceramic housing 21. The holding or clamping mechanism 22 may have a relatively great size or width.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event of circumstance occurs precisely as well as instances in which the event or circumstance occurs to a close approximation. As sued herein with respect to a given value or range, the term "about" generally means within +10%, +5%, +1%, or +0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device package, comprising:
   a first substrate having a first surface and a second surface opposite the first surface;
   a heat dissipation structure disposed on the first surface of the first substrate; and
   a first optical module disposed on the heat dissipation structure and comprising:
      a housing;
      a first optical component disposed on the housing; and
      a light-emitting device disposed in the housing and capable of emitting light toward the first optical component.

2. The semiconductor device package of claim 1, wherein the housing comprises a conductive base to support the light-emitting device.

3. The semiconductor device package of claim 1, wherein the heat dissipation structure comprising a first conductive structure connected to the conductive base.

4. The semiconductor device package of claim 1, wherein the heat dissipation structure comprising a first conductive structure connected to the first substrate.

5. The semiconductor device package of claim 1, wherein the housing comprises a first conductive structure electrically connected to the first optical component.

6. The semiconductor device package of claim 5, wherein the heat dissipation structure comprising a second conductive structure electrically connected to the first conductive structure of the housing and the first substrate.

7. The semiconductor device package of claim 6, further comprising a semiconductor device electrically connected to the first substrate and the second conductive structure of the heat dissipation structure.

8. The semiconductor device package of claim 1, further comprising a semiconductor device, wherein the heat dissipation structure has recess to accommodate the semiconductor device.

9. The semiconductor device package of claim 8, wherein the semiconductor device is attached to the heat dissipation structure.

10. The semiconductor device package of claim 1, wherein the first optical module further comprises a detector, wherein the housing comprises a first conductive structure electrically connected to the detector.

11. The semiconductor device package of claim 10, wherein the housing is electrically disconnected from the first optical component.

12. The semiconductor device package of claim 1, further comprising a second optical module disposed at a side to the first optical component and comprising:
   a second substrate;
   a detector module disposed on the second substrate; and
   a first lid disposed on the detector module and comprising an extension portion in direct contact with the detector module.

13. The semiconductor device package of claim 12, further comprising:
   a second lid disposed on the second substrate; and
   a connection element disposed between the first lid and the second lid.

14. The semiconductor device package of claim 13, wherein the first lid is disposed on the second lid, and wherein the extension portion of the first lid extends below the connection element.

15. The semiconductor device package of claim 12, wherein the detector module comprises a detector and a cover disposed on the detector, and wherein the extension portion of the first lid is in direct contact with the cover of the detector module.

16. A semiconductor device package, comprising:
 a first substrate;
 a first optical module disposed on the first substrate and comprising:
  a housing;
  a first optical component disposed on the housing; and
  a light-emitting device disposed in the housing and emitting light toward the first optical component; and
 a second optical module disposed at a side to the first optical component and comprising:
  a second substrate disposed on the first substrate;
  a detector module disposed on the second substrate; and
  a first lid disposed on the detector module and comprising an extension portion in direct contact with the detector module.

17. The semiconductor device package of claim 16, wherein the first optical module further comprises a detector, wherein the housing comprises a first conductive structure electrically connected to the detector.

18. The semiconductor device package of claim 17, wherein the housing is electrically disconnected from the first optical component.

19. The semiconductor device package of claim 18, further comprising a heat dissipation structure comprising a second conductive structure electrically connected to the first conductive structure of the housing and the first substrate.

20. The semiconductor device package of claim 19, further comprising a semiconductor device electrically connected to the first substrate and the second conductive structure of the heat dissipation structure.

21. The semiconductor device package of claim 17, further comprising:
 a second lid disposed on the second substrate; and
 a connection element disposed between the first lid and the second lid.

22. The semiconductor device package of claim 21, wherein the first lid covers the second lid.

23. The semiconductor device package of claim 21, wherein the extension portion of the first lid extends over the connection element.

24. The semiconductor device package of claim 16, wherein the detector module comprises a detector and a cover disposed on the detector, and wherein the extension portion of the first lid is in direct contact with the cover of the detector module.

* * * * *